US006551973B1

(12) United States Patent
Moore

(10) Patent No.: US 6,551,973 B1
(45) Date of Patent: Apr. 22, 2003

(54) STABLE METAL-SAFE STRIPPER FOR REMOVING CURED NEGATIVE-TONE NOVOLAK AND ACRYLIC PHOTORESISTS AND POST-ETCH RESIDUE

(75) Inventor: John Cleaon Moore, Hollister, CA (US)

(73) Assignee: General Chemical Corporation, Parsippany, NJ (US)

( * ) Notice: Subject to any disclaimer, the term of this patent is extended or adjusted under 35 U.S.C. 154(b) by 8 days.

(21) Appl. No.: 09/974,704

(22) Filed: Oct. 9, 2001

(51) Int. Cl.$^7$ .............................. C11D 7/32; C11D 7/60; C11D 3/30
(52) U.S. Cl. ..................... 510/176; 510/175; 510/255
(58) Field of Search .............................. 510/175, 176, 510/255, 421, 424; 134/40

(56) References Cited

U.S. PATENT DOCUMENTS

| 5,091,103 A | | 2/1992 | Dean et al. | |
| 5,419,779 A | | 5/1995 | Ward | |
| 5,496,491 A | | 3/1996 | Ward | |
| 6,020,292 A | * | 2/2000 | Honda et al. | 510/175 |
| 6,191,086 B1 | * | 2/2001 | Leon et al. | 510/175 |

OTHER PUBLICATIONS

DuPont Printed Circuit Materials, "Proprietary Strippers," Riston Series Dry–Film Photoresists, DuPont Photopolymer & Electric Materials, DS99–56 (Dec. 1999) Rev.3.0, p.8.

A. Reiser, *Photoreactive Polymers*, Wiley–Interscience Publications, NY 1989, pp. 163–167.

Dietz, K., and Coffin A., "Clean Stripping of Dry Film Photoresists on Non–Copper Surfaces," Proceedings from PCMI Meeting—Sep. 1995, pp. 14–17.

X. Shi. A. Fung, S. Hsu Z. Li., T. Nguyen R. Socha, W. Conley, M. Dusa, "Dual Damascene Photo Process Using Negative Tone Resist," Advances in Resist Technology and Processing XVII Proceedings, SPIE 3999, 835.

Lester, Maria A., "Clean Approaches for Dual–Damascene," Semiconductor International, Aug. 1999, p.51.

D. Louis, E. Lajoinie, F. Pires, W.M. Lee, D. Holmes, "Post Etch Cleaning of Low–K Dielectric Materials for Advanced Interconnects: Characterization and Process Optimization," Microelectronic Engineering, 41/42 (1998), 415–418.

* cited by examiner

*Primary Examiner*—Gregory E. Webb
(74) *Attorney, Agent, or Firm*—Arthur J. Plantamura

(57) ABSTRACT

A stripping composition is provided for removing polymeric organic substances from an inorganic substrate. The stripping composition comprises about 3 to about 15 weight percent aromatic quaternary ammonium hydroxide, preferably benzyltrimethylammonium hydroxide (BTMAH), about 50 to about 87.5 weight percent alkylsulfoxide, a co-solvent preferably a glycol, and, desirably, a suitable corrosion inhibitor and a non-ionic surfactant. Also provided is a method for stripping polymeric organic substances (i.e., negative-tone novolak and acrylic photoresists and post-etch residue) from inorganic substrates by contacting the polymeric organic substance with the organic stripping the BTMAH composition for a period of time sufficient to remove said polymeric substances.

7 Claims, 2 Drawing Sheets

Stripping Efficiency of BTMAH invention on Negative Tone Novolak Photoresist from Sapphire Substrate.

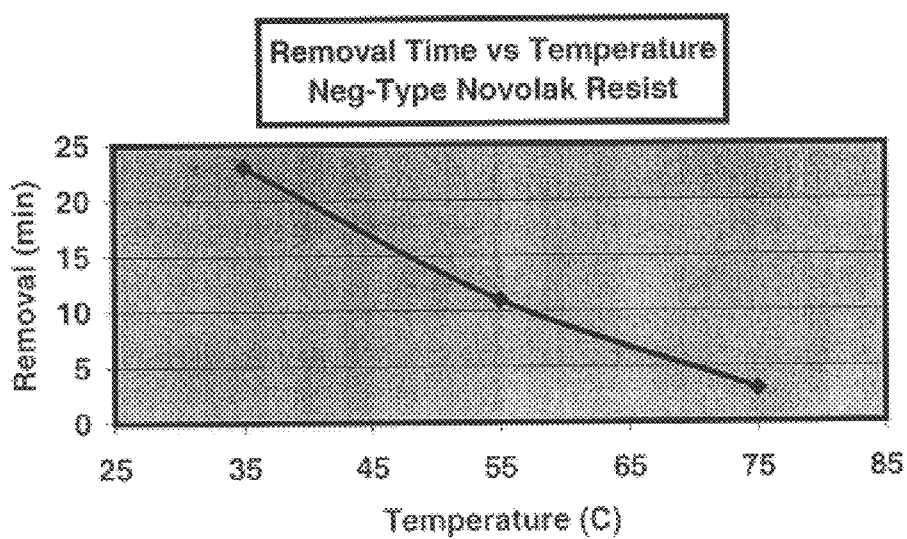
FIG. 1.    Stripping Efficiency of BTMAH invention on Negative Tone Novolak Photoresist from Sapphire Substrate.

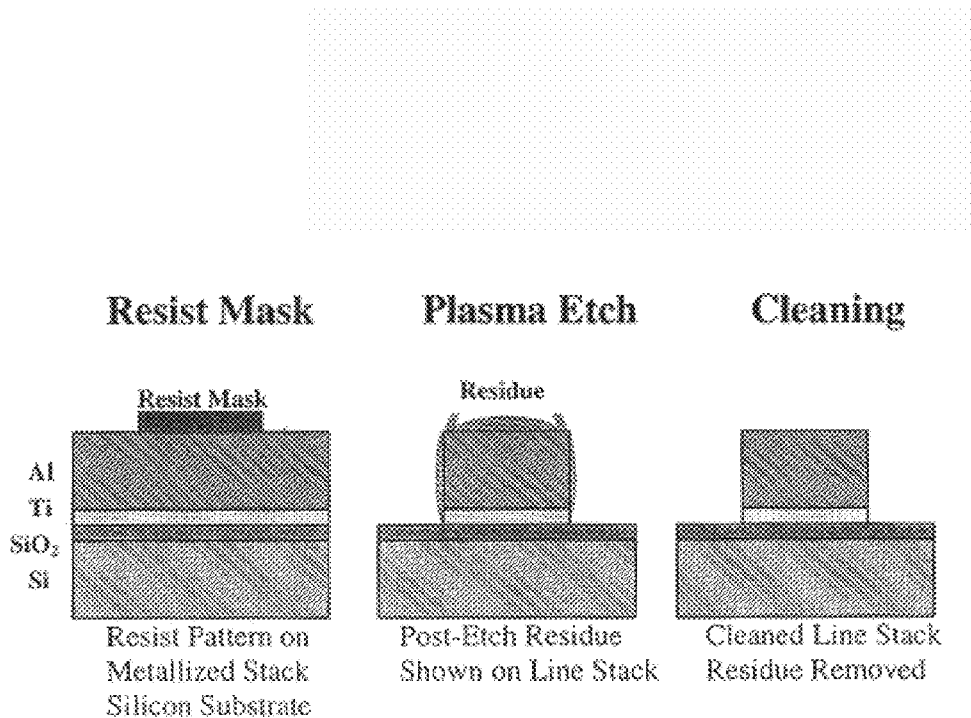
FIG. 2. Removal of plasma-induced post-etch residue using BTMAH invention.

STABLE METAL-SAFE STRIPPER FOR REMOVING CURED NEGATIVE-TONE NOVOLAK AND ACRYLIC PHOTORESISTS AND POST-ETCH RESIDUE

BACKGROUND OF THE INVENTION

This invention relates to organic stripping compositions containing a heat-stable aromatic quaternary ammonium hydroxide useful in removing hydrophilic polymeric organic substances such as photoresists and their residues from inorganic substrates.

During the manufacture of semiconductors and semiconductor microcircuits, materials from which the semiconductors and microcircuits are manufactured are coated with a polymeric organic substance which forms a resist mask after undergoing a photolithographic process. The resist mask is used to protect selected areas of the substrate surface, e.g. silicon, silicon dioxide, aluminum, or copper, etc., from the action of chemicals in both wet (solution) and dry (plasma) forms. In turn, these chemistries interact with the exposed areas of the substrate to carry out desired etch (removal) and deposition (add) processes. Following completion of this operation and after subsequent rinsing or conditioning, it is necessary that the resist mask and any applicable post-etch residue be removed to permit essential finishing operations.

A common method used in removing the cured resist mask from the substrate is by direct contact with an organic stripper. The chemistry of the stripper penetrates the polymer surface and may undergo a reaction to sever cross-linked portions and facilitate the swelling, lifting, and removal from the surface of the inorganic substrate. The protected area of the substrate is then revealed, typically silicon and its native oxide or a hybrid compound semiconductor such as gallium arsenide and may include sensitive metallic microcircuitry, such as aluminum or copper. Prior stripping compositions have usually been less than satisfactory or have the distinct disadvantage of unacceptable toxicity and/or presenting pollution problems from the disposal of such compounds as phenol, cresol, sulfonic acid, chlorinated hydrocarbons.

The efficiency and selectivity of such stripper is extremely desirable. There is need, accordingly, for improved stripping compositions which will remove the polymeric organic substance from the coated inorganic substrate without corroding, dissolving or dulling the surface of the metallic circuitry or chemically altering the inorganic substrate.

Other prior art inorganic stripping compositions for removing polymeric organic substances, for example, comprise aqueous sulfuric acid compositions containing a significant amount of fluoride ion to reduce metallic dulling and corrosion, as exemplified in U.S. Pat. No. 3,932,130. Some photoresist strippers require the presence of fluoride ion stabilizers to prevent metallic, especially aluminum, corrosion and operate at elevated temperatures.

It is an object of this invention to provide an organic stripping composition which operates effectively without containing the prior mentioned toxic substance and at moderate temperatures, to clean effectively and quickly, organic photoresist materials from metallized inorganic substrates. It is also an object of this invention to provide the same organic stripping composition for removing sub-micron films, coatings, and other forms of organo-metallic residue found in and on micro-device structures such as vias (holes) and lines (metal stacks) resulting from plasma-induced etch processes. The removal process of a cured negative-tone novolak or acrylic resin photoresists and in applications following a plasma etch process, the removal of both the resist mask and post-etch residue is conducted without causing substantial etching of the inorganic substrate or the corrosion or dulling of the metallic circuitry present as adjacent structures.

BRIEF DESCRIPTION OF DRAWINGS

FIG. 1 describes the cleaning performance dependence on temperature and time.

FIG. 2 describes the mechanism of removal of post-etch residue using BTMAH.

SUMMARY OF THE INVENTION

In accordance with this invention there is provided a stripping composition for removing polymeric organic substances from an inorganic substrate, the stripping composition comprising about 3 to about 15 weight percent aromatic quaternary ammonium hydroxide, preferably benzyltrimethylammonium hydroxide (BTMAH), a solvent, preferably comprising 50 to about 87.5 weight percent alkylsulfoxide, a glycol, and, desirably, a suitable corrosion inhibitor and a non-ionic surfactant.

The invention/contemplates, also, the provision of methods for stripping negative-tone novolak and acrylic photoresists and residual polymeric organic substances (i.e. post-etch residue) from inorganic substrates comprising contacting the polymeric organic substance with the organic stripping composition of this invention for a period of time sufficient to remove said polymeric substances.

DETAILED DESCRIPTION OF THE INVENTION

The present invention provides a stripping composition which quickly and effectively removes polymeric organic substances from inorganic substrates, from metallic, non-metallic and metallized non-metallic substrates and involves methods of using same. The stripping composition comprises a blend of benzyltrimethylammonium hydroxide (BTMAH), combined with various additives, which effectively removes cured negative-tone novolak and acrylic photoresists that comprise the basis for fabricating microcircuits in semiconductor manufacturing. Such coatings in the process of being applied and particularly when reacted with certain cross-linking photo initiators, cure to a hard and highly chemical resistant framework. The stripping composition may also be used to remove post-etch residue resulting from plasma initiated substrate removal processes.

Upon application of the BTMAH compositions of the present invention to these normally chemically resistant polymeric frameworks, the cured polymer breaks down, allowing the disintegrated residue to be rinsed away with water. The removal rates will, of course, vary depending upon the thickness of the polymeric resist coating and the condition to which the coating was exposed during the process. Heating assists in facilitating the removal of the high temperature cured coatings.

The BTMAH stripping compositions of the invention functions by maintaining a strong alkaline environment whereby the solvent penetrates and dissolves cross-linked polymer, typical of a cured negative-tone novolak and acrylic photoresists. The solvent system is composed of a glycol, e.g., ethylene glycol, to stabilize the BTMAH and a polar sulfoxide for polymer dissolution. Advantageous additives contained within the stripping composition may include chelating agents, to maintain metallic solubility, corrosion inhibitors to protect free Copper and Aluminum and a suitable surfactant to aid in penetrating small geometries and in rinsing. Although quaternary ammonium hydroxide (QAH) compounds are chosen for alkaline saponifying and emulsification of polymers, the BTMAH in particular offers added heat stability and bath life, enabling the product to be used in elevated temperatures for prolonged periods of the kind that involve common process parameters for removing tenacious polymer coatings. When BTMAH is combined with the selected solvents and additives, the chemical system of the invention affords an excellent vehicle for processing microelectronic parts where reliable performance must be maintained and safety to the substrate and adjacent metal devices must be protected.

A typical composition in accordance with the invention comprise the (BTMAH) benzyltrimethylammonium hydroxide, a solvent system and preferable, includes also, a corrosion inhibitor and a non-ionic surfactant.

The BTMAH content may vary from about 3 to about 15 weight percent and preferably comprise about 4 to about 8 weight percent of the stripper.

The solvent system comprises an alkyl sulfoxide e.g. dimethyl sulfoxide (DMSO), above or in combination with dimethyl sulfone ($DMSO_2$), The sulfoxide solvent is employed in amounts of from about 50 to about 87.5 weight percent and preferably in proportions of about 60 to about 75 weight percent. Other common photoresist solvent families such as amides, aldehydes and ketones are not stable with BTMAH. Due to the alkali nature of BTMAH, these other solvents tend to react with BTMAH via. Hoffman Degradation (amides) and Reductive Amination (aldehydes and ketones) to reduce the hydroxide to trimethylamine and adversely affect performance. Suitable stable glycol co-solvents that may be employed with the BTMAH include, for example, ethylene glycol.

Alternatives to ethylene glycol include propylene glycol, glycerin or other polyhydric alcohols. The co-solvent such as ethylene glycol may be present with the sulfoxide solvent in amount of from about 15 to about 30 weight percent and preferably in amount of about 18 to about 25 weight percent. Water may also be added for selective removal of one polymer over another. In such cases, water makes up approximately 10% of the mix.

To afford protection for transition metals such as copper and aluminum, a suitable corrosion inhibitor such as BTA (benzyltriazole), TTA (tolytriazole), MBTA (mercaptobenzyltriazole), or combinations thereof may be incorporated into the stripper composition. Alternatives to these inhibitors include pyrolgallol (neutral form of gallic acid) and pyrocatachol (catachol). Corrosion inhibitor inclusion in amounts not in excess of about 5 weight percent and preferable of the order of about 1 to about 3 weight percent is sufficient.

A suitable chelating agent such as EDTA (ethylenediaminetetraacetic acid) is preferably also included. The basified and solubilized form of this chelating agent is added to complex with the ionized metals that are impregnated in the matrix of the target polymer as a result of plasma induced reactive processing. Alternative chelates include the basified versions of DTPA (diethylenetriaminepentaacetic acid); NTA (nitrilotriacetic acid), and 2,4-pentanedione. All of these products are converted to an alkaline form before use in the stripper matrix. Without this adjustment, the "weak acid" form of the chelate neutralizes the BTMAH and product performance drops.

Suitable surfactants include non-ionic alkoxylated linear alcohols such as the tradename Polytergent SL92, available from BASF Corporation. The surfactant functions to reduce surface tension and aid in the rinsing process. The surfactant preferably has a high cloud point (i.e. >60° C.) to allow for heated processing and rinsing without miscibility issues. A non-ionic environment is required for inert conditions towards dissolved metals and maximum solubility in a wide range of media, both solvent and water. Low foaming capacity allows for product use in various automated equipment. Alternative surfactants include nonyl-phenols and nonyl-ethoxylates with a HLB (hydrophilic/lipophilic balance) ranging from 7–15. Less than about 2 weight percent of the non-ionic surfactant and preferable an amount of about 0.01 to about 0.4 weight percent is sufficient.

For most uses, the temperature employed for suitable performance has not been found to be critical; any ambient temperature conveniently in the range of from about 15° C. to about 40° C. is effective for proper operation of the stripping compositions of the present invention. Processing conditions may require using a temperature in excess of about 40° C., especially where an automated spray or ultrasonic tool are used, when a rate increase is desired, or when the removal of more than one substance is desired such as the simultaneous stripping of a resist mask and sidewall polymer.

The stripping composition quickly and effectively removes organic polymers from metallized and metallic surfaces. It has been proven that deposited Copper is not attacked by the stripping composition during extended periods of time. When measured with a thickness profilometer common to most microelectronic fabrication labs, it was discovered that the removal rate for Copper was <0.10 angstroms/min. This rate was unchanged for a period in excess of 24 hours. This level of protection is deemed sufficient for many microelectronic designs that incorporate metallized Copper into their devices.

The present invention also resides in providing a method of removing an organic polymeric material from an inorganic substrate which comprises contacting the polymeric organic substance with the BTMAH stripping composition for a period of time sufficient to remove the polymeric substances.

The polymeric organic substances which are removed by the stripping solutions of this invention are photoresists which generally comprise polymers selected from novolak (phenol formaldehyde and m-cresol) and acrylic resins. These photoresists are applied to an inorganic substrate, e.g. silicon and its native oxide or a compound semiconductor, e.g. gallium arsenide, and may be metallized with aluminum and copper in masked portions thereof. The coated substrate is then exposed through a defined pattern with ultra violet (UV) light of specified energy and conditions, e.g. a 120 volt 650 watt quartz lamp for 1–15 seconds at a distance of $1.524\text{-}3\text{-}3.048\times10^{-1}$ m. For negative photoresists, the area exposed undergoes a chemical curing reaction, becomes cross-linked, and physically hardens. For the same resist, the portion which is not exposed, i.e., masked from the light, is then removed by a mild solvent which does not dissolve the exposed photoresist. Thus, a cured and hardened mask that represents a portion of an electrical circuit pattern is left on the substrate. The portion of the substrate which is not covered by the mask is exposed to chemicals which cause a controlled etch or deposition occurrence. The etchant may be a buffered oxide etchant, e.g. $NH_4F/HF$, acid, base or plasma induced etchant, e.g. $CF_4/Cl_2$. Whether it be etching or deposition, interaction of the chemistries with the resist occurs, causing further hardening, metal ion impaction, and where applicable, post-etch residue. The hardened photoresist and any applicable post-etch residue must be removed before the substrate can be further processed or used.

In employing the stripping solutions of this invention, the substrate covered with the cured photoresist and where applicable, post-etch residue, is brought in contact with the stripping solution at a range of temperatures, conveniently in the range of about 15° to about 40° C.; the temperature employed for effective operation of present invention is not critical. Times required for stripping the photoresist and/or post-etch residue vary to quite an extent depending on the specific polymer used in the photoresist, the photoresist prefacing conditions, and the conditions and equipment of the removal process. Generally, the time involved will be between 60 and 600 seconds, although some photoresist depending on the baked temperature, may require $0.9 \times 10^3$ seconds, $1.8 \times 10^3$ seconds or even $3.6 \times 10^3$ seconds of contact with stripping solutions before the polymeric photoresist is completely loosened or removed from the substrate. It should be appreciated that many photoresists are completely removed from the substrate while others may be loosened, floated off, and then are dissolved in the stripping composition. Among the photoresists, which produce cured mask coatings or where their applicable processing produce a post-etch residue, that may be stripped by the composition of the present invention, the varieties listed in the table below are exemplary:

TABLE

| TYPE NEGATIVE | TRADEMARKS | SOURCE |
| --- | --- | --- |
| Acrylic | THB-130N, THB-430N | JSR Microelectronics, Inc. |
| | RISTON Dry Film | E. I. duPont deNemours and Co. |
| | LAMINAR Dry Film | Shipley Company, L.L.C. |
| Novolak | NFR 016 D2 | JSR Microelectronics, Inc. |
| (Phenol Formaldehyde and m-Cresol) | SAL-606 | Shipley Company, L.L.C. |
| TYPE POSITIVE | | |
| Acrylic | THB-611P | JSR Microelectronics, Inc. |
| Novolak | AZ 1000 and 4000 series | Clariant Corporation. |
| (Phenol Formaldehyde and m-Cresol) | Waycoat HP-104 or HP-204 | Philip A. Hunt, Inc. |
| | Microposit 1000 series, FSC | Shipley Company, L.L.C. |

It is to be understood that other positive and negative photoresists, where applicable to this invention, having a broad range of molecular weights can have their applicable cured mask or their post-etch residue be effectively removed by the stripping composites of the present invention.

After the photoresist has been stripped from the substrate, the substrate may then be rinsed in water, isopropanol, or mixtures thereof; other hydrophilic rinsing solvents well known to one of ordinary skill in the art may also be used.

Among inorganic substrates found useful in the present invention are silicon and its native oxide, silicon nitride, gallium arsenide and gallium nitride. Indium phosphide, sapphire, all of which may be metallized with aluminum, copper, or other elements. Other inorganic substrates conveniently used in the art are also considered within the scope of the present invention.

While the stripping compositions in the method of the present invention operate in bath at temperatures about 25° C., other temperatures and apparatus are considered within the scope of this invention. If the stripping compositions of the present invention are used in a tank apparatus with agitation such as a spray module and maintained at a temperature of about 40° C., the time required for the stripping solution to completely remove the polymeric organic coating or etch residue would be ⅛ of the stripping time required at 25° C. temperature in a bath. In another embodiment of the present invention the stripping composition operates to remove polymeric organic substances within applied ultrasonic energy. The invention may employ an ultrasonics unit with a specific transducer frequency and generating power deemed acceptable for processing sensitive microelectronic devices.

The compositions of the invention and the method of making of the examples which follow are described. It is understood, however, that the invention is not meant to be limited to the details described therein. In the examples the percentages provided are percent (%) by weight unless otherwise stated.

GENERAL PROCEDURE

In preparing the stripping compositions of the invention, the order of addition shall follow the relative concentration of each ingredient, successively from large to small. Therefore, the solvent components shall be added, followed by the quaternary ammonium hydroxide, and finally, the additives and surfactant. Each of the various components are measured in the desired proportion and introduced into a suitable mixing vessel and thoroughly mixed by stirring. Any alternative suitable means to effectively intermix the components such as by concurrent introduction of streams of the respective components, or any other suitable known means that fully intersperse the components may be used. Once mixed, the stripping composition is stable, with no detectable separation of components and has excellent shelf life when stored at standard warehouse conditions.

The photoresist compositions employed are any of the commercially available organic photosensitizer alkaline soluble resin formulations which comprise (a) a suitable sensitizer such as diazo-ketone compounds, e.g., naphthaquione-1,2-diazo sulfonic acid esters, (b) a novolak or acrylic resin and (c) a suitable solvent such as xylene. Photoresists are generally described, for example, on page 67 in the work done by D. J. Elliot in Integrated Fabrication Technology, McGraw-Hill Book Company, 1982.

Equipment and Materials:

Equipment, common ware, and materials were used to screen test a variety of specimens. Equipment includes a range of substrate coupons, UV and thermal curing items, identification scopes with a high resolution system having digital imaging, scanning electron microscope (SEM), and various ultrasonic cleaning equipment having frequencies of 40, 80 and 170 kHz. Analytical equipment include physical property an chemical characterization instruments from simple pH meters, flash point testers to UV/VIS scanning, GC, and ICP-MS. Facilities were also present for product purification to include distillation (vacuum, up to 10 plates), filtration, and desiccation.

Procedure:

Negative-tone novolak or acrylic photoresist was applied and cured according to the manufacturer's recommendations on sapphire substrates. Metal coupons were pure composition.. All stripping processes were carried out in small glass vessels utilizing static conditions (i.e. no agitation). Observations were done with the aid of an optical microscope (50–3000 X). Stability tests utilized standard analytical methods for activity via the presence of an active species.

Results:

Complete removal of the negative-tone resist was demonstrated using the BTMAH product of the invention. Performance was shown to be dependent upon temperature and time. The results varied from 23 minutes at 35 C. to 3 minutes at 75 C.

Bath life (stability) was determined on the stripping composition of the invention. Measurement of bath life was determined based upon performance. Namely, during continued thermal exposure, agitation, and parts processing, the bath life was identified to be that duration of time from start to that point in which the noted negative-tone photoresist was either not completely removed or not rinsed to produce a clean substrate. The results of bath life was determined to be greater than 60 hrs. when held at 60–70 C. For purposes of microelectronic fabrication, a period of 60 hrs. is deemed to be acceptable for continual processing of parts. Although tests suggest that the stripping composition of the invention offers consistent performance for up to 60 hrs., it is believed that the actual bath life far exceeds this figure.

The invention was also tested on the removal of plasma-induced post-etch residue. The substrate is a silicon wafer with microcircuitry present. Through successive photolithographic, deposition, and plasma etch steps, device structures were made upon the silicon. In this example, the device structure had the form of lines on the wafer substrate. Each line is composed of layers of metallic features (aluminum) to form a "stack". Using a scanning electron microscope (SEM); the lines were evident to have residue, commonly referred to as "post-etch residue". Other identities include sidewall polymer (i.e. formation of same substance on the "wall" of the feature and redeposition (i.e. organometallic deposit generated from plasma condensates). Upon exposure of wafer to the noted stripping invention at varying conditions of temperature and time noted in this invention, the post-etch residue was found to be completely removed. No adverse or subsequent unwanted effects were noted to occur on the device. Namely, the part was rinsed and dried using accepted measures and observations were made using the SEM.

Results of the test indicate that the stripping composition performed the desired cleaning rapidly and selectively.

NOTE:

The provisions of additional specific examples would be desired.

Although the invention has been described in terms of specific tests and embodiments, one skilled in the art can substitute other tests and embodiments and these are meant to be included herein. The invention is only to be limited by the scope of the appended claims.

What is claimed is:

1. A stripping composition for removing polymeric organic substances from an inorganic substrate, the stripping composition comprising about 3 to about 15 weight percent BTMAH benzyl trimethyl ammonium hydroxide and about 50 to about 87.5 weight percent of a solvent system comprising an alkylsulfoxide.

2. The composition of claim 1 wherein the solvent system comprises a blend of alkylsulfoxide and a glycol co-solvent in amounts of about 15 to about 30 weight percent.

3. The composition of claim 2 in which the stripper composition contains up to about 5 weight percent of a corrosion inhibitor.

4. The composition of claim 1 in which the stripper composition incorporates up to about 5 weight percent of a corrosion inhibitor and non-ionic surfactant in amounts not to exceed about 2 weight percent.

5. The composition of claim 1 comprising a solvent system of dimethylsulfoxide and ethylene glycol, about 1 to about 3 weight percent of a corrosion inhibitor and about 0.1 to about 0.4 weight percent of a non-ionic surfactant.

6. In a method for removing polymeric organic substances from an inorganic substrate the improvement characterized in that the substrate is contacted with the stripping composition of claim 1 for a period of time sufficient to remove said substance.

7. In a method for removing normally insolubilized polymeric organic substance identified as post-etch residue the improvement characterized in that the substrate is contacted with the stripping composition of claim 5 for a period of time sufficient to remove said polymeric organic substance.

\* \* \* \* \*